United States Patent
Schuttert et al.

(10) Patent No.: US 9,838,165 B2
(45) Date of Patent: Dec. 5, 2017

(54) EMULATION AND DEBUG INTERFACES FOR TESTING AN INTEGRATED CIRCUIT WITH AN ASYNCHRONOUS MICROCONTROLLER

(75) Inventors: Rodger F. Schuttert, Eindhoven (NL); Geertjan Joordens, Sunnyvale, CA (US); Willem F. Slendebroek, Lent (NL)

(73) Assignee: NXP B.V., Eindhoven (NL)

( * ) Notice: Subject to any disclaimer, the term of this patent is extended or adjusted under 35 U.S.C. 154(b) by 1206 days.

(21) Appl. No.: 11/995,603

(22) PCT Filed: Jul. 12, 2006

(86) PCT No.: PCT/IB2006/052372
§ 371 (c)(1),
(2), (4) Date: Oct. 24, 2008

(87) PCT Pub. No.: WO2007/010452
PCT Pub. Date: Jan. 25, 2007

(65) Prior Publication Data
US 2009/0105978 A1 Apr. 23, 2009

(30) Foreign Application Priority Data
Jul. 15, 2005 (EP) .................................... 05106522

(51) Int. Cl.
*H04L 1/20* (2006.01)
*G01R 31/317* (2006.01)
(Continued)

(52) U.S. Cl.
CPC ........ *H04L 1/205* (2013.01); *G01R 31/31725* (2013.01); *G01R 31/31937* (2013.01); *H04L 1/242* (2013.01)

(58) Field of Classification Search
CPC ......... H04L 1/205; H04L 1/242; H04L 1/244; H04B 3/46
(Continued)

(56) References Cited

U.S. PATENT DOCUMENTS 6,298,458 B1 10/2001 Cranford, Jr. et al.
6,772,382 B2 * 8/2004 Schaber et al. ............... 714/744
(Continued)

FOREIGN PATENT DOCUMENTS

EP 0889411 A2 1/1999

OTHER PUBLICATIONS

Soma, M—Institute of Electrical and Electronics Engineers: "A Mixed-Signal Framework and Standard for High Frequency Timing Measurements" 2001 IEEE Autotestcon Proceedings. IEEE Systems Readiness Technology Conference. vol. Conference 37, Aug. 20, 2001, pp. 504-513.

(Continued)

*Primary Examiner* — Ricky Ngon (57) ABSTRACT

A method of testing a data transmission and reception system comprises sending a test signal from a transmitter (14) of the system to a receiver (12) of the system, and analyzing the received signal. A duty cycle relationship is varied between the test signal and the timing signal used by the receiver of the system, and the effect of the duty cycle variation is analyzed. Varying the duty cycle relationship provides duty cycle distortion (DCD), and this can be considered as a form of embedded jitter insertion. This type of jitter can be measured relatively easily.

21 Claims, 11 Drawing Sheets

(51) Int. Cl.
*G01R 31/3193* (2006.01)
*H04L 1/24* (2006.01)

(58) Field of Classification Search
USPC ..... 702/58, 59, 66, 69, 74, 79, 17, 118, 122,
702/124–126, 189, 190; 375/224–226,
375/219, 220, 221, 327, 358; 714/7.12,
714/715, 716, 750–752; 370/245, 246,
370/748, 10, 30, 31, 241, 242, 248, 249,
370/351; 327/2, 26, 31, 39, 170, 166;
324/523, 76.52–76.54, 76.59, 76.58;
455/226.1, 73, 84–86, 227, 115.1, 115.2,
455/130
See application file for complete search history.

(56) References Cited

U.S. PATENT DOCUMENTS

| | | | |
|---|---|---|---|
| 6,873,939 B1 * | 3/2005 | Zerbe et al. | 702/189 |
| 7,120,215 B2 * | 10/2006 | Li et al. | 375/371 |
| 7,612,592 B2 * | 11/2009 | Parikh | 327/175 |
| 2005/0068079 A1 * | 3/2005 | Yeh | H03K 5/1565 |
| | | | 327/175 |
| 2006/0182187 A1 * | 8/2006 | Likovich et al. | 375/257 |
| 2009/0003419 A1 * | 1/2009 | Iadanza | 375/219 |

OTHER PUBLICATIONS

IEEE Standard 802.3AE-2002, Section 48B.3.1.3.1 "Approximate Curve Fitting for Bert Scan" pp. 510-511.

* cited by examiner

EMULATION AND DEBUG INTERFACES FOR TESTING AN INTEGRATED CIRCUIT WITH AN ASYNCHRONOUS MICROCONTROLLER

This invention relates to the testing of a transmission and reception system, in particular to verify reliability of data transfer within equipment using the system. For example, the transmission and reception system will typically be for providing data to, and receiving data from, a high-speed data bus which provides communication between different parts of an integrated circuit (IC) or between different ICs.

Serial communication transceivers (transmitter/receiver devices) are widely used for data transfer between ICs, circuit boards and systems. The interfaces can operate at data rates above the capabilities of test equipment used in production, and this presents difficulties for the hardware testing. The high-speed interfaces need to correctly reconstruct received bits from the received signal in the presence of a certain level of distortion, particularly jitter.

Considerable design effort is required to achieve the high data rates and guarantee operation under relevant process, voltage and temperature variations. As a consequence, small production flaws can cause the interface to be out of its specification limits.

Existing production test methods aimed at detecting structural faults may not be capable of detecting all relevant production faults in the circuitry for high speed interfaces. It is possible to design test equipment specifically for a particular system to measure the jitter generation at the transmitter and jitter tolerance at the receiver. However, this is an expensive and time consuming approach and may not be viable.

A widely used alternative for specification-based testing in production is the use of a so-called "loop-back test", by which a known transmitter output is supplied to a receiver, and analysis of the received signal can be used to test the complete system characteristics. The loop-back test is typically supported by embedded pattern generation and bit error counters, in order to decrease test equipment requirements.

A disadvantage of this method is that the range of defects that can be detected is limited for both the transmitter and receiver, particularly as the receiver is designed to tolerate certain amounts of jitter and attenuation from the transmitter.

Phase locked loops are typically used for the generation of internal clock signals from an external system clock signal. In synchronous systems, the accuracy of different internal clock signals, with respect to the master system clock signal, is one factor which influences the performance of the transmission and reception of data between different parts of the system which are operated by different internal clocks. There will typically be a phase shift between the system clock signal and the master clock signal, and the way this phase difference varies over time (the time derivative of phase difference) is defined as the timing jitter.

Bit errors occur when interpreting received data if a recovered clock edge samples a neighbouring bit in the bit stream, and if this neighbouring bit has an opposite value. Due to jitter, the moment of the data transitions vary around their ideal moment. Jitter has different physical root-causes; some root-causes like thermal noise result in a Gaussian distributed probability (Random Jitter, RJ) while other root-causes like cross-talk cause deterministic jitter (DJ) and have other types of distributions. Since the RJ is unbounded there is always a probability of a bit error. In normal conditions, the design margin guarantees that the probability of a bit error is low, for example a probability (i.e. Bit Error Ratio) of $10^{-12}$ is often used in specifications.

One known method to improve the detection capability of a loop-back test is to insert jitter into the high-speed signal. Jitter can be inserted using a voltage-controlled variable delay element, generally driven by a sine wave. The jitter can be inserted on-chip or off-chip. The level of inserted jitter has to be known accurately to make this method suitable for production test. Off-chip implementation requires specific equipment as well as probing and routing of high-speed signals. On-chip jitter insertion often suffers from poor reliability under process, voltage and temperature variations.

An example of a self-test circuit for testing the PLL phase and jitter is described in EP 0 889 411, and this uses the introduction of known delays, and comparison measurements are used to derive a measure of average maximum jitter.

According to the invention, there is provided a method of testing a data transmission and reception system, the method comprising sending a test signal from a transmitter of the system to a receiver of the system, and analyzing the received signal, wherein the method comprises varying a duty cycle relationship between the test signal and the timing signal used by the receiver of the system, and analyzing the effect of the duty cycle variation.

Varying the duty cycle relationship provides duty cycle distortion (DCD), and this can be considered as a form of embedded jitter insertion. This type of jitter can be measured relatively easily, for example with a low-pass filtered DC measurement. Furthermore, since the DCD will be measured back the required accuracy of induced DCD is low, allowing the on-chip implementation of DCD to be relatively simple. In particular, the method does not require any alteration to the transmitter or receiver functional operation and can be implemented with low use of IC area and with simple test equipment.

Varying a duty cycle relationship may comprise varying the duty cycle of the test signal, for example in the path between the transmitter output and the receiver input. However there are other ways of varying the duty cycle relationship, for example varying a duty cycle of a clock recovered in the receiver which is used for sampling the received test signal.

The analysis may comprise bit error ratio measurement. The combination of insertion of various amounts of DCD and bit-error ratio measurements allows a small number of measurements to be taken, in a sufficiently short time that is suitable for production testing. The measurement results can be used to calculate relevant jitter properties like random jitter (RJ), deterministic jitter (DJ) and total jitter (TJ). Total jitter is a known combination of the DJ and RJ characteristics of the transceiver under test, using statistical methods.

The method of the invention can be used for (clock recovery) PLLs that lock on one edge, and can then measure jitter on rising and falling edges separately. This increases the diagnostic possibilities needed to find root-causes of detected faults. The method of the invention can also be used for PLLs that lock on both edges.

In one implementation, DCD is added by splitting the high-speed signal in two branches. In one branch, the high-speed signal is delayed by a programmable amount of time. This can be implemented by adding a programmable amount of load. The two branches can then be combined in parallel AND and OR gates. The AND gate output gives a decreased duty cycle while the OR gate gives an increased duty cycle. A multiplexer can then be used to select the decreased or increased duty cycle.

The programmable load and multiplexer control can be provided by a shift register arrangement.

The loop-backed high-speed signal with inserted DCD can be connected to receiver input pins. The actual amount of inserted DCD can be measured internally (on-chip), or off-chip on these Rx pins. To measure this off-chip with the use of a signal tester Parametric Measurement Unit (PMU) or Digital Voltmeter (DVM) the signal can be low-pass filtered by connecting resistors to the two differential Rx pins and a capacitor between the two resistor's other terminals. After a multiple of (e.g. 7) the RC time constant, a stable measurement of the DC voltage can be made, and for a . . . 010101 . . . pattern, a 0V level is expected in the case of a 50% duty cycle. Under presence of DCD the resulting DC level will differ proportionally to the amount of DCD (which has units of time, such as picoseconds).

The difference with the DC value when no DCD is inserted is of particular interest. This relative measurement can be made with good accuracy in a production test, limited for example by the PMU or DVM resolution, for example 250 micro-Volts for a typical test equipment PMU.

The receiver typically uses a clock-and-data recovery (CDR) circuit having a PLL which locks to the received high-speed signal. Depending on the PLL implementation, locking can be done on one or both edges. When the CDR PLL locking is performed using only one of the rising or falling edge, the edge used by the PLL to lock can be made selectable, to enable detection of faults related to both edges. When the PLL locks on both edges, the inserted DCD will affect both edges.

The recovered CDR clock is typically used to sample the received high-speed data on both rising and falling edges. With the CDR locking on one edge of the high-speed signal, the DCD causes the opposite data edge to be displaced with respect to its normal position. This results in an increased probability of bit errors on those edges. Preferably, a bit-error counter in the receiver allows this probability to be measured.

Since the actual amount of inserted DCD may vary from chip to chip due to spread in process parameters, the measured inserted DCD and corresponding BER may be processed to determine a pass/fail condition. A statistical evaluation can be used to extract the relevant jitter levels from the measured DCD and corresponding BER.

The invention is of particular benefit in detecting production faults in the transmitter or receiver hardware, which can cause increased jitter generation and/or decreased jitter tolerance, as these result in higher BER of the loop-backed signal.

The invention also provides an apparatus for testing a data transmission and reception system, comprising:

means for generating a test signal for transmission;

means for varying a duty cycle relationship between the test signal and the timing signal used by the receiver of the system; and means for analyzing a received signal which comprises the transmitted signal after the effect of duty cycle variation, thereby to analyze the effect of the duty cycle variation.

This apparatus is for use with a data transmission and reception system, comprising the transmitter and the receiver.

Examples of the invention will now be described in detail with reference to the accompanying drawings, in which.

The invention relates to the testing of a transmission and reception system. The invention is of particular applicability to a system in which a Clock and Data Recovery (CDR) circuit is used in the receiver to derive clock timing information and perform data recovery from a received data stream.

There are many different architectures suitable for CDR circuits. Three main architectures can be classified as an over-sampling architecture, a tracking architecture and a phase-interpolation architecture.

In an over-sampling architecture, multiple samples are taken for each bit period. An algorithm decides which bit is best suited to use. For very high speed signals, it becomes impractical to build clocks that allow data over-sampling.

In a tracking architecture, a phase locked loop is used that locks on the received data.

With a phase interpolation architecture, which is essentially an alternative form of tracking, the transmit clock is used and phase aligned with the incoming data, so only the phase is tracked. This is usually done by a loop that selects the phase that is closest to the data transition.

An example of the invention will now be given based on a tracking architecture, although it will be apparent that the invention can also be applied to other architectures.

The invention is based on the addition of duty-cycle distortion (DCD) to displace the position of data edges with respect to the recovered clock edges in a controlled and measurable way. The probability of bit errors, measured as a BER, will then be higher. From the measured edge displacement and corresponding BER the standard deviation of the RJ can be calculated, as well as the peak-to-peak level of the DJ.

When locking occurs on either the rising or falling edge of the received bitstream, the introduced DCD will essentially displace the opposite data edges with respect to the recovered clock edges, covering faults related to these edges. To cover faults related to the other edges, a test procedure is required that allows to select the edge on which the CDR PLL locks.

Figure 1:
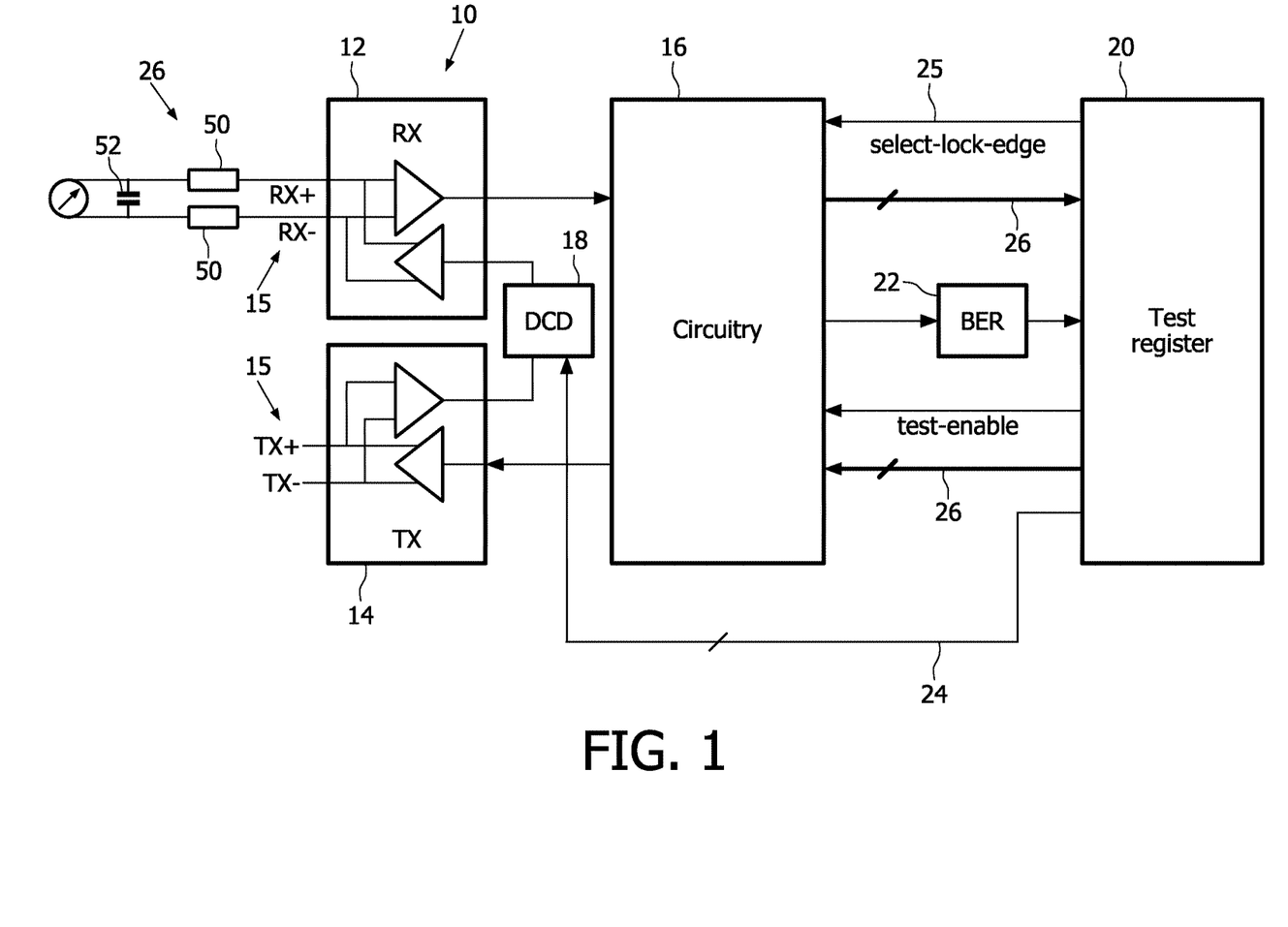
FIG. 1 shows a transmission and reception system of the invention.

FIG. 1 shows a system of the invention for providing testability to a transmission and reception system, using DCD insertion.

The apparatus comprises a transceiver 10 having a receiver 12 and a transmitter 14, and these interface between a high speed communications bus 15 and a serial circuit 16. A loopback path is defined between the output of the transmitter 14 and the input of the receiver, and this path includes a duty cycle distortion (DCD) element 18. The DCD element 18 is controlled by a test register 20 which also performs analysis of the signals received by the circuit 16 using the receiver 12. In the example shown, this analysis involved bit error ratio (BER) measurement, implemented by BER unit 22. The control of the DCD element is shown as 24. FIG. 1 also shows that the signal to which DCD has been applied is also supplied to a measurement circuit 26, which may be on or off-chip, and this enables measurement of the applied DCD before the signal has passed through the receiver.

FIG. 1 also shows that the test register 20 has a control output 25 "select lock edge". As will be described below, this may or may not be required, depending on the manner in which clock recovery is carried out. FIG. 1 also shows data communications paths 26 between the test register and the circuitry 16. FIG. 1 also shows a "test_enable" control signal which enables selection of different test modes, for example the loopback mode, a pattern generation mode, and an error compare mode. The implementation of the invention can be considered as five operations:

DCD insertion;
DCD measurement;
Selection of lock edge (if required);
BER measurement; and
Jitter analysis The jitter analysis is not shown in FIG. 1, and this analysis can be implemented as software on the test equipment. The first three operation are the focus of this invention.

The insertion of Duty Cycle Distortion can be implemented in several different ways. One possibility is to use the intrinsic difference in fall and rise time of circuit elements. For example, a standard multiplexer with two inputs A and B in a given CMOS process has a difference between fall and rise time of the order of 20 ps. A chain of multiplexers can be configured, where each multiplexer output connects to input A of the next multiplexer, and input B connects to the original signal. Each multiplexer adds then a DCD of 20 ps to the signal; and the total DCD can be programmed by selecting the number of multiplexers in the signal path. This implementation of DCD has the disadvantage that the original signal is used to drive all multiplexer inputs B, which requires a large buffer for this signal.

Figure 2:
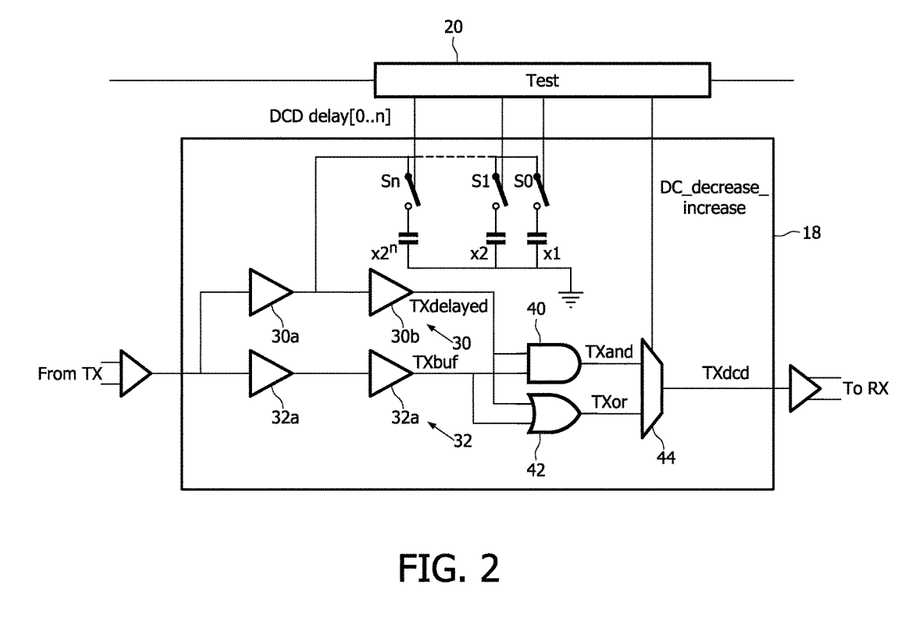
FIG. 2 shows in more detail the duty cycle control unit use in the system of FIG. 1.

An example method of implementing duty cycle distortion will be described with reference to FIG. 2, and which avoids the need for a large buffer. FIG. 2 shows an n+1 bit programmable DCD circuit In the DCD insertion circuit 18 of FIG. 2, the high-speed signal from the transmitter is used in two branches, "TXdelayed" (branch 30) and "TXbuf". (branch 32). Each branch comprises first and second buffers $30a,30b$ and $32a,32b$. The signal propagates with a certain delay through these branches. For the branch 30 "TXdelayed", the delay can be increased by selectively adding load to the first buffer $30a$. As alternative, the drive strength of the buffer can be made programmable, if needed in combination with programmable load.

Load-selection bits "DCD delay[0 . . . n]" are programmed by shifting control bits into a test register 20. The values of the loads are then chosen as a binary coded $(1,2,4 \ldots 2^n)$ multiple of a capacitance value ×1. A linear array of switches S0-Sn couple the capacitors to the output of the buffer $30a$, where n+1 is the number of switches used. The control bits "DCD delay[0 . . . n]" control the switches S0 to Sn, and when a switch is closed the capacitance is added to the load seen by the buffer.

Figure 3:
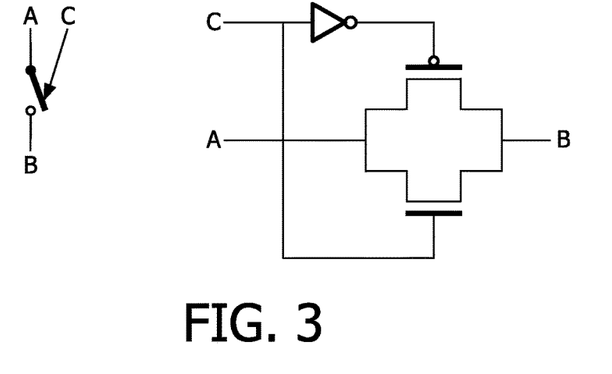
FIG. 3 shows how the switch in the unit of FIG. 2 can be implemented.

Each switch S0-Sn can be implemented as a transmission gate as shown in FIG. 3.

The two branches TXdelayed and TXbuf in FIG. 2 are used as inputs to an AND gate 40 as well as an OR gate 42 in parallel. The output of the AND gate "TXand" provides a signal with reduced duty cycle; and the OR gate output "TXor" provides a signal with increased duty-cycle.

Figure 4:
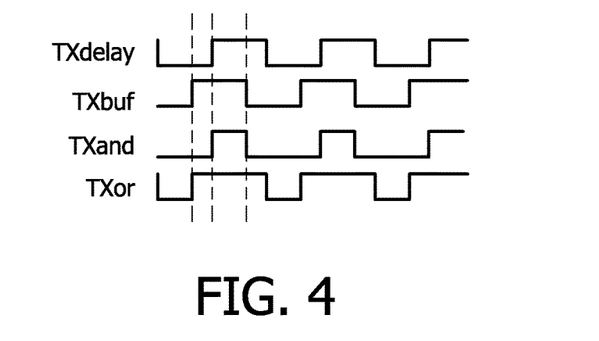
FIG. 4 shows a timing diagram for explaining the operation of the unit of FIG. 2

FIG. 4 shows the signals in the two branches, and illustrates the outputs from the AND and OR gates for a given relative delay between the two branches. The difference in duty cycle between the signals TXand and TXor can clearly be seen.

The increased or decreased duty-cycle signal is selected by a multiplexer 44 (shown in FIG. 2). The multiplexer control signal "DC_decrease_increase" is provided by the test register 20.

The buffers $30a,30b,32a,30b$, AND/OR gates 40,42 and multiplexer 44 potentially add to the DCD, so that the DCD is not dependent solely on the capacitive load added. This is not critical since the DCD is also measured at the receiver pins by the circuitry 26 shown in FIG. 1.

However, any DCD added by these circuits will be present as a DCD offset. An unbalanced offset could create the risk that the duty cycle cannot be increased or decreased sufficiently to produce a significant amount of bit errors in limited time.

For this reason, buffers are added in both branches 30,32, as shown, to make the default delay through both branches approximately equal. At least one buffer in the TXbuf branch 32 is needed to physically separate the two branches. To allow the range of programmable DCD decrease and increase to be as equal as possible, the nominal delay in both branches should be equal.

The duty-cycle distortion can be measured at the circuitry 26 (of FIG. 1) in various ways, for example using an oscilloscope. For production test it is preferred to have low requirements to equipment. One piece of equipment that is generally available in a test system is a Parametric Measurement Unit (PMU). A PMU can be used to measure DC voltage and currents. In testers equipped with a Digital Voltmeter (DVM) the DVM can also be used.

With the addition of a low-pass filter the PMU or DVM can also be used to measure the duty cycle of a bit-stream. One implementation is to add a low-pass filter on the tester-to-device interface board, for example two resistors 50 connecting to the receiver pins 48 and a capacitor 52 connected to the other two terminals of the resistors, as shown schematically in FIG. 1 and in more detail in FIG. 5. The resistor-capacitor arrangement functions as a low pass filter, and of course other filter configurations can be used.

Figure 5:
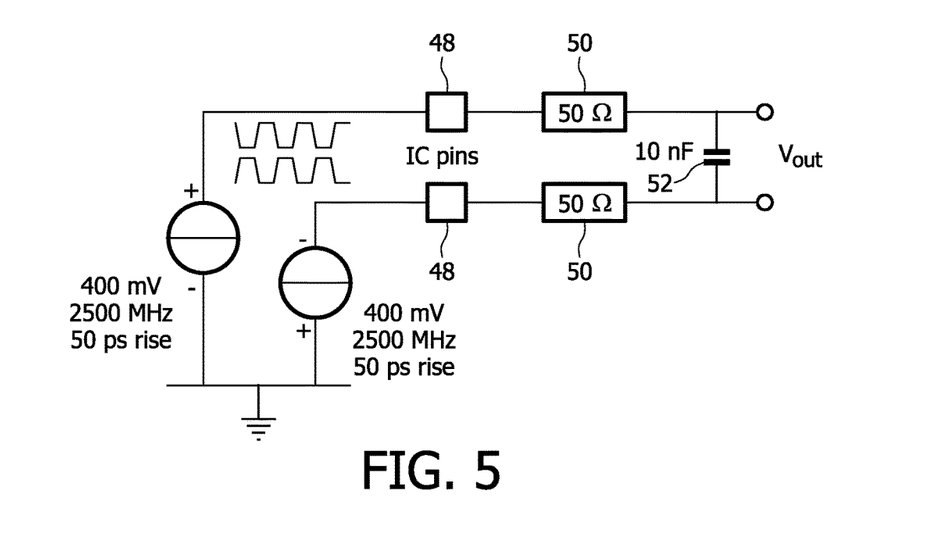
FIG. 5 shows circuitry for measuring the duty cycle.
Figure 6:
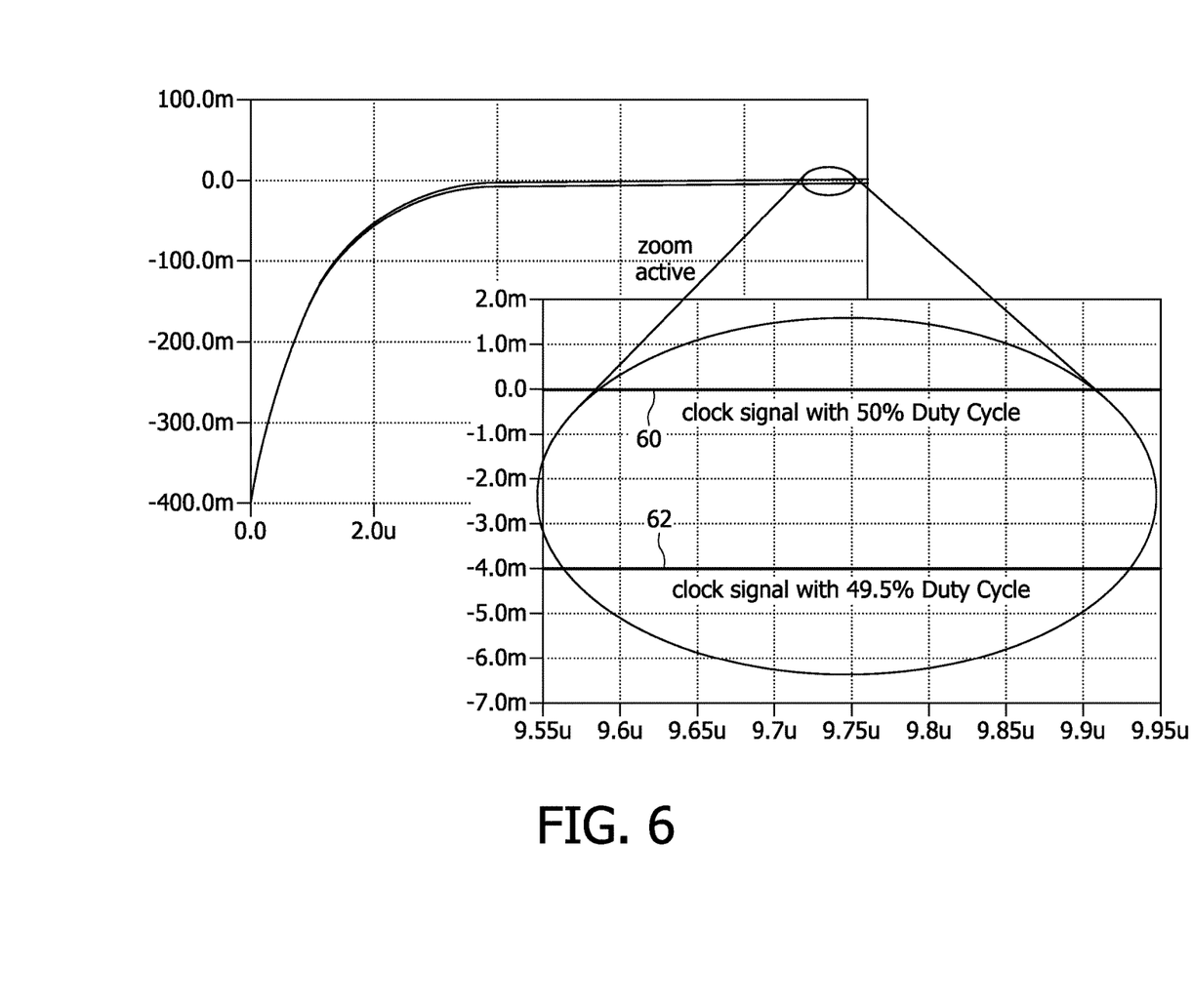
FIG. 6 shows is used to explain the operation of the circuit of FIG. 5.

The DC value of the output voltage Vout measured between the two terminals of the capacitor is an RC charge curve, as represented in FIG. 6. The time constant is derived from the sum of the two resistors (i.e. 2*50=100 Ohm for the values used in FIG. 5).

The circuit in FIG. 5 is of course only one example, and in other interface implementations voltage levels may be different, for example due to external DC biasing or an external load to a reference voltage.

FIG. 6 shows a simulation of low-pass filtered clock signals with 50% duty cycle (plot 60) and 49.5% duty cycle (plot 62). The reduced duty cycle corresponds to DCD of 2 ps. The resulting DC value is an average of the time 'high' minus the time 'low' of the high-speed signal. The 50% duty-cycle clock signal will approach a DC level of 0V at Vout. In general, the DC output voltage on the positive leg will be:

$$Vout_{Dc,positive\ leg} = V_{min} + (1 - e^{-t/RC})*(duty\_cycle)*(V_{max} - V_{min})$$

With $V_{max}$ and $V_{min}$ being the 'high' respectively 'low' voltage. Similarly, the DC output on the negative leg is:

$$Vout_{Dc,negative\ leg} = V_{max} - (1 - e^{-t/RC})*(duty\_cycle)*(V_{max} - V_{min})$$

The resulting DC output voltage Vout over the capacitor terminals is the difference:

$$Vout_{DC} = Vout_{DC,positive\ leg} - Vout_{DC,negative\ leg}$$
$$= V\min - V\max + 2*(1 - e^{-t/RC})*(duty\_cycle)*(V_{max} - V_{min})$$

For the example of FIG. 6, the signal with 49.5% duty cycle, for $V_{max}$=400 mV and $V_{min}$=0V will approach:

$$Vout_{DC} = -0.4 + 2*(1-0)*0.495*0.4 = -4\ mV.$$

The output voltage can also be measured between one of the two capacitor terminals and a reference voltage (e.g. ground). This has the disadvantage that the resulting difference between voltages will be proportional to the duty-cycle-distortion times the voltage swing, rather than proportional to double this value (as in the equations above).

The low-pass filter can be implemented on-chip, with on-chip switches connecting the low-pass filter to the high-speed signal. The output signal Vout has to be made observable at IC pins, for example using an analog test bus (for example IEEE 1149.4).

The DC voltage measurement is directly affected by voltage amplitude as well as the duty-cycle. Typically, the output voltage levels are measured in a separate dedicated test, and these measured levels are used to determine the duty cycle in combination with the low-pass filtered DC test.

As mentioned above, there is an option of selecting how to implement the lock edge for clock recovery. There are essentially two options, one is the use of a PLL which locks on both edges, and the other is the use of a PLL which locks on one edge.

The use of PLLs that lock on both edges within the clock and data recovery (CDR) circuit results in both data edges being displaced with respect to their ideal location as a result of the introduction of DCD. Thus, both edges contribute to an increased BER.

Figure 7:
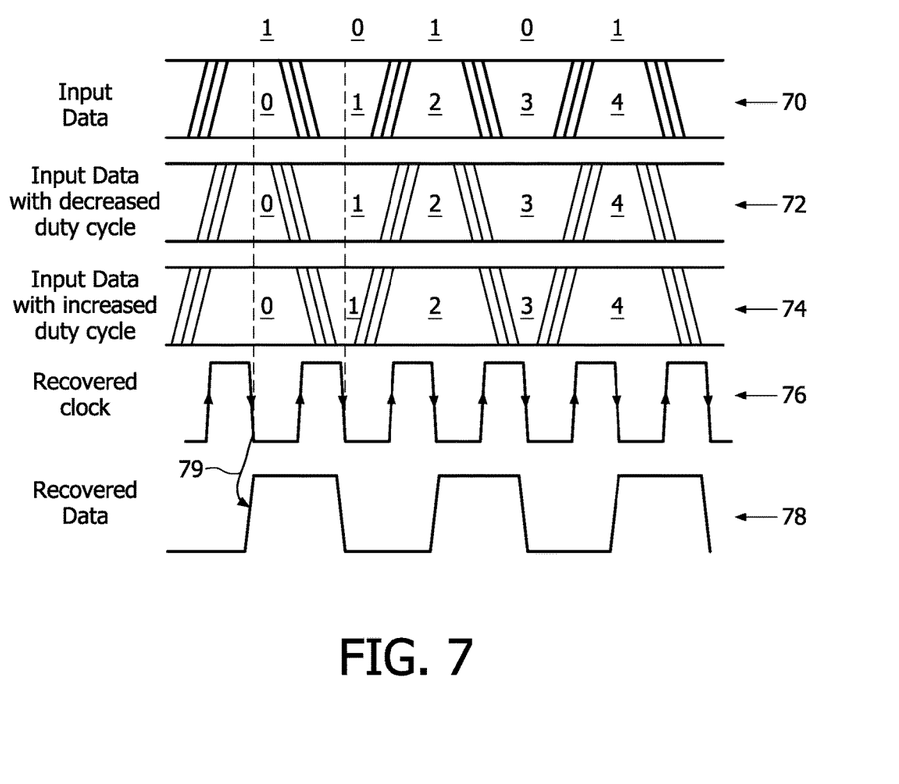
FIG. 7 is a first example of timing diagram showing the effect of duty cycle variation.

FIG. 7 shows a situation with a recovered clock at the full data rate. Of course, a different clock rate rata versus data rate is possible. Most commonly, full rate and half rate CDRs are used. For a full rate CDR, 1 clock cycle corresponds to 1 bit, and the rising edge is used for clock recovery, and the falling edge is used for data recovery. For a half rate CDR, 1 clock cycle corresponds to 2 bits, and both the rising and falling edges are used for clock recovery. A 90 degree phase shifted clock is used for data recovery, and recovered clock has half the frequency of the data rate. Full data rate clock recovery is shown by way of example.

The example signals in FIG. 7 are for a "10101" pattern; for other patterns the displaced edge positions will differ according the transitions.

The top plot 70, of the input data, shows a 50% duty cycle. The next two plots 72, 74 show the transitions between 1 and 0 shifted to provide decreased and increased duty cycle respectively. The transitions move symmetrically about the center of the eye diagram. When the duty cycle is either decreased or increased, the probability of having an error in sampling any other bit increases.

The plot 76 shows the recovered clock, in which the clock 1 to 0 transition has been timed with the center of the detected input data eye. This 1 to 0 clock transition is used to recover the data as represented by arrow 79.

The use of PLLs that lock on one edge results in the data edge on which the CDR PLL will lock to be fixed. The data edges opposite to the edges on which the PLL locks are the displaced edges and faults related to these edges will contribute to the BER. FIG. 8 again shows a recovered clock at the full data rate, and the different plots in FIG. 8 correspond to those in FIG. 7.

The example signals in FIG. 8 are again for a "10101" pattern, and the displaced edges 80 are those associated with the falling edges of the data.

If the duty cycle is decreased, and locking occurs on rising edges (as in the second plot of FIG. 8), the probability increases of having an error in sampling the last high bit before a transition to low.

When the duty cycle is increased (the third plot in FIG. 8), the probability increases of having an error in sampling the next low bit just after a transition to low increases.

From the above, it can be seen that under presence of inserted DCD, the jitter related to the edge on which the PLL locks will not increase the BER, only jitter related to the next transition will increase the BER.

Potential faults related to the data edges on which the PLL locks are then not detected.

To overcome this possible drawback, the edge on which the PLL locks can be made to be switchable.

Figure 8:
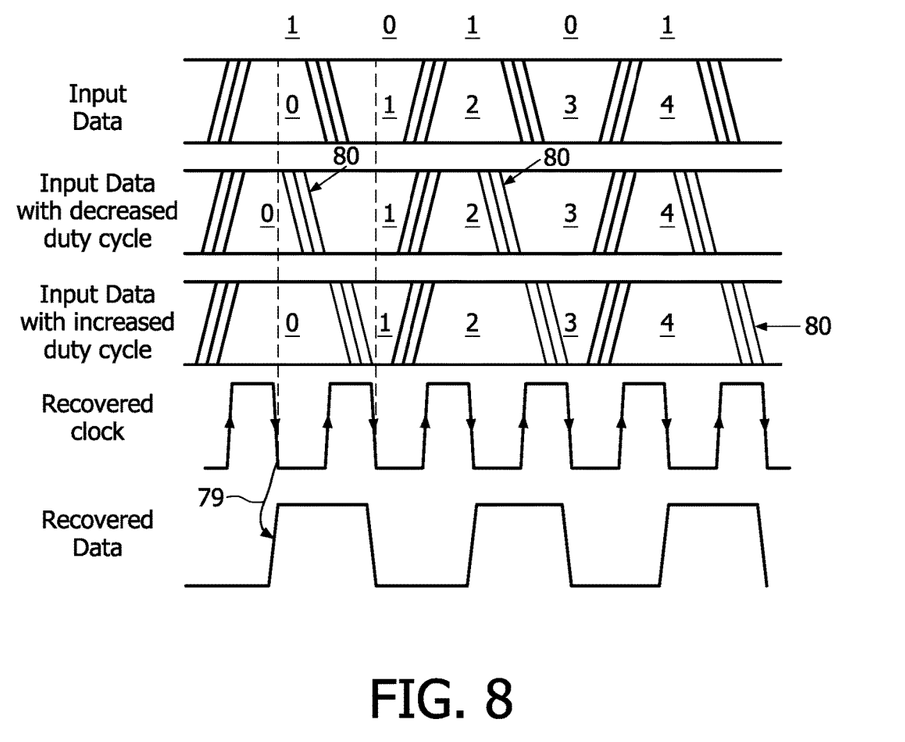
FIG. 8 is a second example of timing diagram showing the effect of duty cycle variation.
Figure 9:
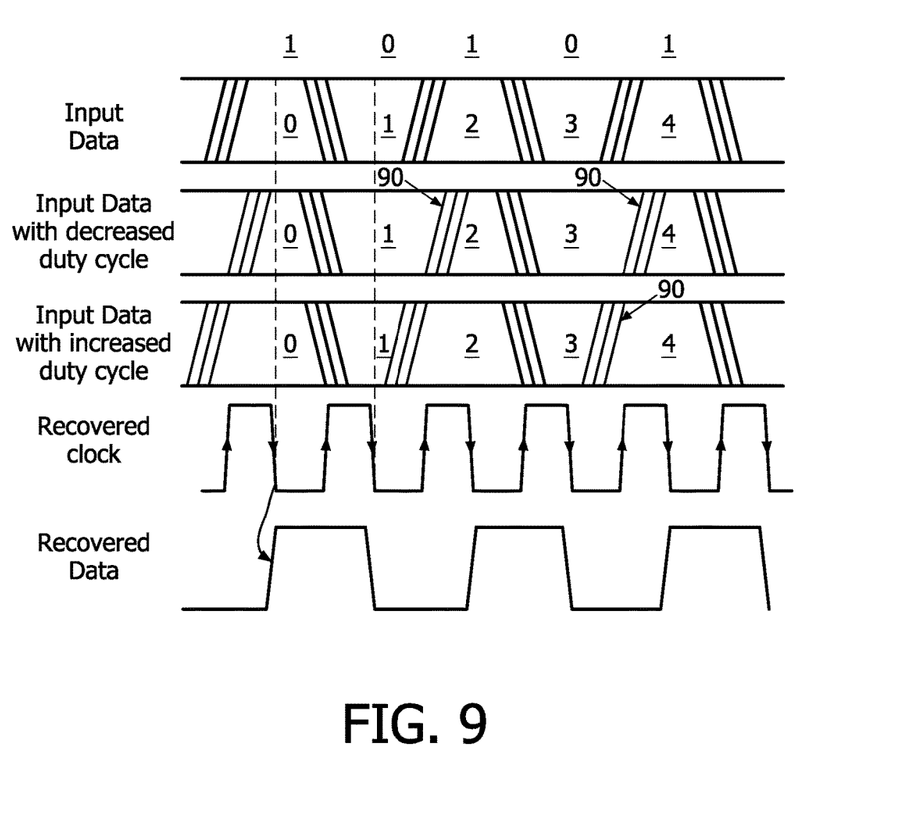
FIG. 9 is a third example of timing diagram showing the effect of duty cycle variation.

FIG. 9 shows the same plots as FIG. 8, but with the CDR signals locking on falling edges, so that the displaced edges 90 are those associated with the rising edges of the data.

In this case, if the duty cycle is decreased (second plot in FIG. 9), the probability of having errors related to the rising edges increase. Similarly, if the duty cycle is decreased, the probability of having errors related to the falling edges increases (third plot in FIG. 9).

In this way, by making the locking edge selectable, all rising and falling transitions contributing to BER can separately be tested. This is the purpose of the control signal 25 in FIG. 1.

Figure 10:
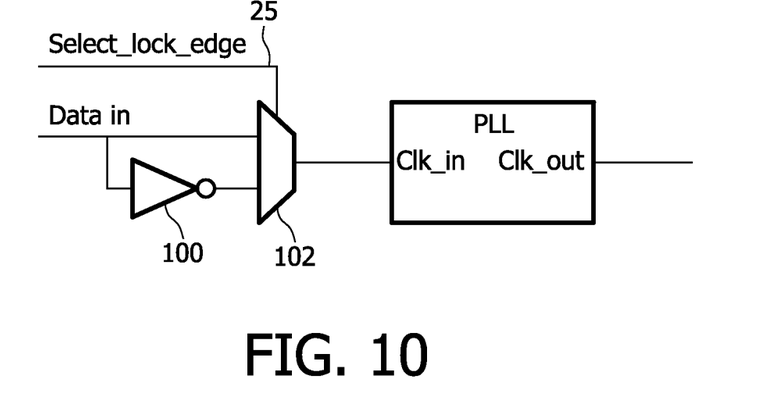
FIG. 10 shows one way to switch between PLL lock edges.

FIG. 10 shows one way to implement a selectable lock edge, in which the data on which the PLL locks is inverted.

An inverter is used to provide inverted data, and the original data and the inverted data are provided to a multiplexer 102 which selects one of the data signals based on a control input "Select_lock_edge". The control signal "select_lock edge" can be provided by the test register 20.

Figure 11:
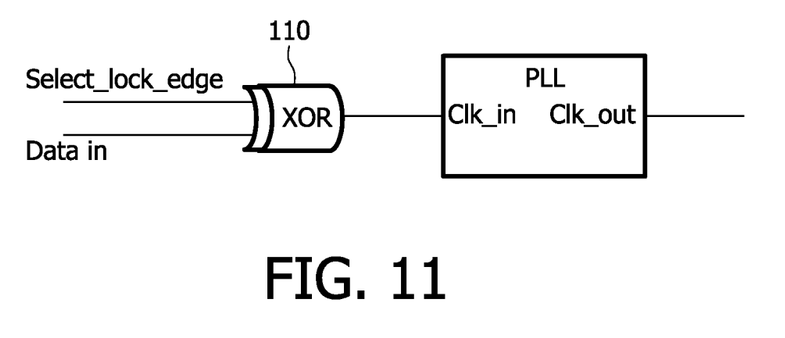
FIG. 11 shows another way to switch between PLL lock edges.

As a second example, shown in FIG. 11, an XOR gate 110 can be used with the "Select_lock_edge" control signal and the data ("data_in") as inputs.

As a third alternative, if the signals used are differential signals, the differential polarity can simply be reversed to achieve inversion.

As outlined above, the aim of the analysis to be carried out is to perform jitter measurement and tests. Jitter is one of the main courses of bit errors in a serial transceiver. A high speed signal with increased DCD will be more susceptible to jitter and cause more bit errors.

One way to use the programmable DCD is to increase DCD until a first bit error is observed. Since jitter is partly of a stochastic nature it is unpredictable when a bit error will occur. Therefore, it is preferred to count the number of bit errors, expressed as a bit-error ratio representing the number of received erroneous bits as ratio of the total number of received bits.

Bit error counters are well known the art, and conventional devices can be used to implement the unit 22 shown in FIG. 1.

To perform the jitter analysis based on the obtained bit error ratio measurements, the test equipment records one or more DCD levels with the corresponding bit error ratios.

A widely used method to analyse the performance of a receiver is to plot the BER versus eye-opening. The log-linear plot of BER versus eye-opening typically resembles the shape of a bathtub and is often referred to a bathtub curve.

From the bathtub curve, the level of random and deterministic jitter can be estimated using curve-fit techniques. For this, one or more measurement results with level of inserted DCD level and corresponding BER are needed. These jitter calculations also take into account how the clock recovery has been implemented, particularly whether the PLL lock is done on one or both edges.

An example is a relative simple method using two bathtub curve points is an estimate curve fit method described in IEEE Std 802.3ae-2002, Section 48B.3.1.3.1 "Approximate curve fitting for BERT scan", pp 510-511. This method estimates the random jitter a, deterministic jitter, peak-to-peak level and total jitter peak-to-peak level. With this method the quantiles of two BER levels are plotted against the eye-opening. The slope of the straight line drawn between these points corresponds to the random jitter (RJ) level, the point where the quantile (BER)=0 line is crossed indicates the peak-to-peak level of deterministic jitter (DJ). The RJ and DJ are combined in TJ according to TJ=DJ+13.8*RJ.

Figure 12:
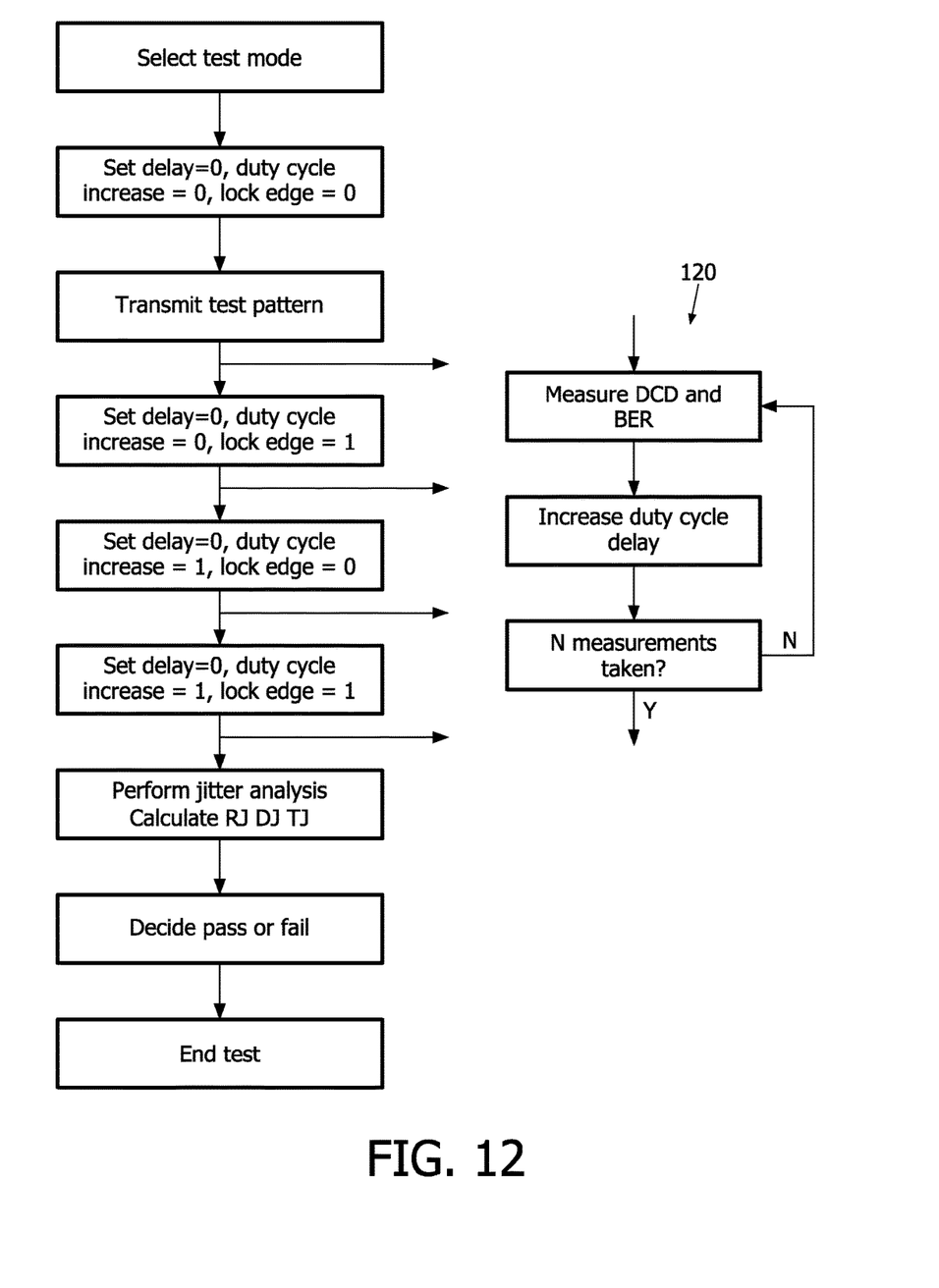
FIG. 12 is a flow diagram for a first method of the invention.

As an example of the usage of the invention for production testing, the following steps can be implemented to complete a jitter test; applied to a PLL that locks on one edge. "Nr_observations" is a pre-determined number of DCD-BER points used in the jitter analysis:

(i) Select loop-back test mode
(ii) Program DCD delay=0, DC_increase_decrease='0', select_lock_edge='0'
(iii) Start transmitting patterns
(iv) Measure and store DCD and BER
(v) Increase DCD delay
(vi) Repeat steps (iv)-(v) another "nr_observations-1" times
(vii) Program DCD delay=0, DC_increase_decrease='0', select_lock_edge='1'
(viii) Repeat steps (iv)-(vi)
(ix) Program DCD delay=0, DC_increase_decrease='1', select_lock_edge='0'
(x) Repeat steps (iv)-(vi)
(xi) Program DCD delay=0, DC_increase_decrease='1', select_lock_edge='1'
(xii) Repeat steps (iv)-(vi)
(xiii) Perform jitter analysis: calculate RJ, DJ and TJ
(xiv) Decide pass or fail
(xv) Stop transmitting patterns This method is shown in FIG. 12. The method implements a test mode in which a number N of BER measurements are taken for incrementally increasing DCD delay values. The N measurements correspond to the value "nr_observations". This is performed by the sub-routine shown as 120. This sub-routine is performed for each lock edge and for increasing duty cycles and for decreasing duty cycles. Thus, four separate sets of data are obtained, and the sub-routine is called four times as shown.

Figure 13:
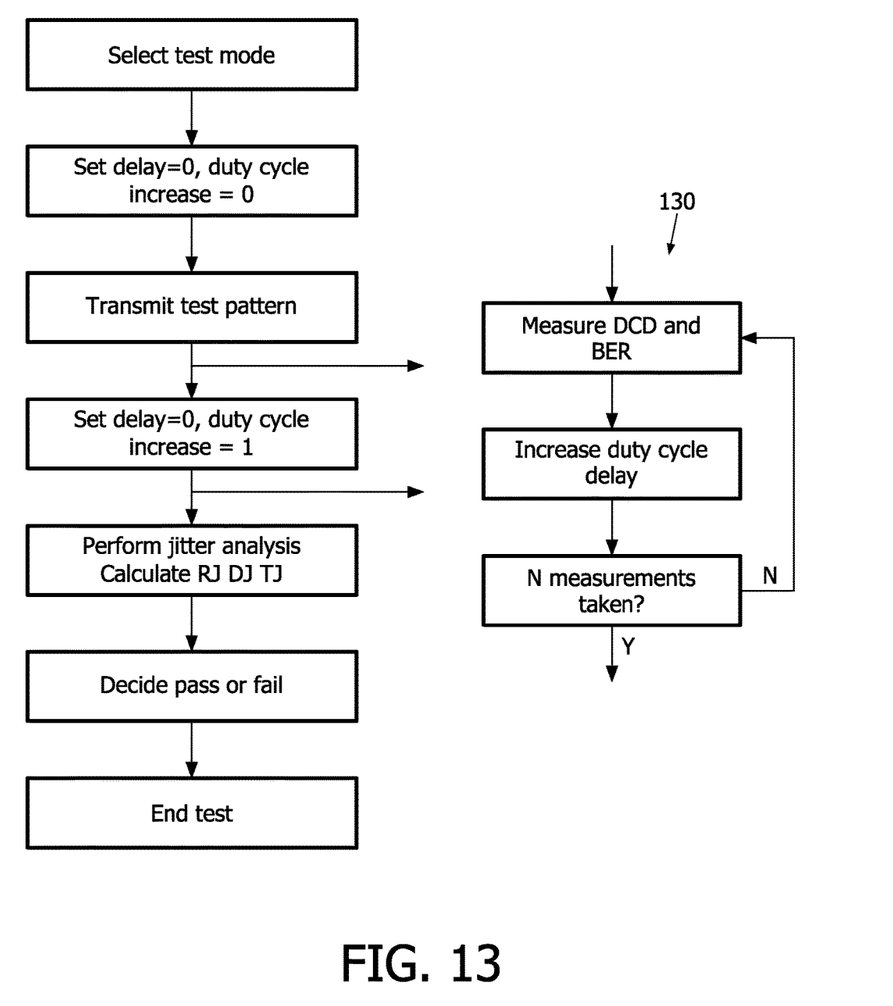
FIG. 13 is a flow diagram for a second method of the invention.

In case of a PLL that locks on both edges the signal "select_lock_edge" is not used. The test sequence in that case is:

(i) Select loop-back test mode
(ii) Program DCD delay=0, DC_increase_decrease='0'
(iii) Start transmitting patterns
(iv) Measure and store DCD and BER
(v) Increase DCD delay
(vi) Repeat steps (iv)-(v) another "nr_observations-1" times
(vii) Program DCD delay=0, DC_increase_decrease='1'
(viii) Repeat steps (iv)-(vi)
(ix) Perform jitter analysis: calculate RJ, DJ and TJ
(x) Decide pass or fail
(xi) Stop transmitting patterns This method is shown in FIG. 13. The method implements a test mode in which a number N of BER measurements are again taken for incrementally increasing DCD delay values. This is performed by the sub-routine shown as 130. and it is performed for increasing duty cycles and for decreasing duty cycles. Thus, two separate sets of data are obtained, and the sub-routine is called twice as shown.

The invention can be applied for production testing of high speed interfaces. Examples of serial interfaces are Serial ATA, PCI Express, DVI, HDMI and USB 2.0. The invention can also be used for parallel types of interfaces such as Double Data Rate memory interfaces.

The examples shown generally use single polarity signals. However, the use of differential signals in circuits of the invention is also possible.

The examples described above relate to serial communications systems in which a receiver recovers a clock and data from a serial bitstream. The invention can also be applied to applications of the invention in which a receiver has an externally provided clock. Also, it is possible to apply the DCD to the transmit clock instead of the data. This has the disadvantage of altering the functional circuit. Other applications may be to make a measurable delay between two sample times, where both sample times respond to different transitions of a clock for which duty cycle is altered and measured. Such a measurable delay might be applied for example in delay-fault testing of digital circuits.

Figure 14A:
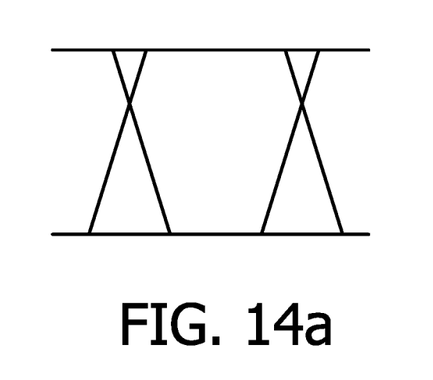
FIGS. 14a and 14b show the effects of different types of duty cycle distortion on the eye diagram.

There may thus be considered to be two types of duty cycle distortion, and these may be considered as data DCD and clock DCD. With data DCD, with DCD inserted after the transmitter, a data "1" is made wider (for example) than a data "0". As a result, the common mode voltage increases, and the cross points in the eye diagram are not centered, but are shifted towards the high or lower rails, as shown in FIG. 14a.

Figure 14B:
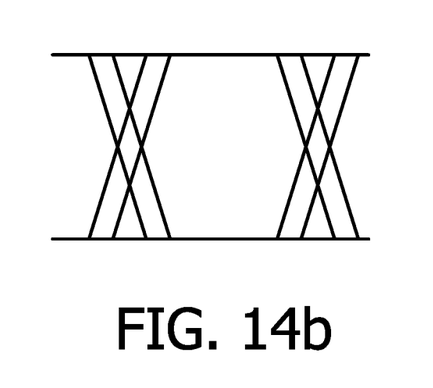

With clock DCD, with DCD inserted before the transmitter and applied to the transmit clock, the common mode voltage is half way between the voltage rails, and the eye diagram transitions shift in time, as shown in FIG. 14b. The CDR can latch onto rising or falling edges or both.

The use of DCD to provide a measurable affect on the probability of bit errors can be used in other examples of loopback test, in order to increase the sensitivity of the loopback test.

In the example above, the DCD is inserted in a path between the transmitter and receiver. For some High Speed I/O interfaces (such as PCI Express), the transmitter and receiver pads are separated and a dedicated loopback path is inserted for test purposes. However, in other bidirectional interfaces (such as USB2.0) the transmitter and receiver pads can be shared, in which case the transmitter output and receiver input are the same. In these cases, there is no loopback path provided for test purposes. The invention can still however be implemented, by adding DCD in the functional path. This requires a bypass possibility for the functional signal, which can be implemented by alteration of the transmitter or receiver functional operation.

In the example above, DCD is measured using a filter and DC measurement technique. DCD can also be measured with other methods, on-chip and/or off-chip. For example, random sampling of the signal can be used, dividing the counted number of '1's by the total number of sampled bits.

Various other modifications will be apparent to those skilled in the art.

The invention claimed is:

1. A method of testing a data transmission and reception system, the method comprising:
    sending a test signal from a transmitter of the system to a receiver of the system;
    analyzing the received test signal;
    varying a duty cycle relationship between the received test signal and a timing signal used by the receiver, wherein said varying the duty cycle relationship further comprises:
        splitting the received test signal sent by the transmitter into first and second branches,
        combining signals processed by the first and second branches in an AND gate to provide a reduced duty cycle, and
        combining signals processed by the first and second branches in an OR gate to provide an increased duty cycle;
    analyzing an effect of the duty cycle variation; and
    selecting, with a multiplexer, between either the increased duty cycle or the decreased duty cycle based upon a binary multiplexer control signal provided by a test register.

2. The method as claimed in claim 1, wherein the duty cycle of the test signal is varied in a path between an output of the transmitter and an input of the receiver.

3. The method as claimed in claim 1, wherein delaying the signal of one branch further comprises:
    adding a programmable amount of load.

4. The method as claimed in claim 1, wherein delaying the signal of one branch further comprises:
    using a programmable drive strength.

5. The method as claimed in claim 1, further comprising:
    low-pass filtering the signal provided to the receiver; and
    measuring a dc voltage which represents the duty cycle.

6. The method as claimed in claim 1, further comprising:
    sampling the signal provided to the receiver; and
    counting the number of sampled '1's and/or '0's, wherein the ratio of counted '1's to the total number of samples represents the duty cycle.

7. The method as claimed in claim 1, wherein the analysis comprises bit error ratio measurement.

8. The method as claimed in claim 1, wherein analyzing the received signal comprises:
    providing a pass or fail indication based on the duty cycle variation and a measured receiver error rate.

9. The method as claimed in claim 1, wherein analyzing the received signal comprises:
    calculating the jitter from the duty cycle variation and a measured receiver error rate.

10. The method as claimed in claim 1, further comprising:
    performing clock recovery from received data in the receiver; and
    using the recovered clock to interpret the received data.

11. The method as claimed in claim 10, further comprising:
    performing clock recovery from rising and falling edges of the received data.

12. The method as claimed in claim 10, further comprising:
    performing clock recovery from the rising or falling edges of the received data; and
    analyzing the effect of duty cycle variation for a recovered clock using the rising edges of the received data and for a recovered clock using the falling edges of the received data.

13. An apparatus for testing a data transmission and reception system, comprising:
    a circuit configured to generate a test signal for transmission;
    a circuit configured to vary a duty cycle relationship between the test signal and a timing signal used by a receiver of the system,
    wherein said varying the duty cycle relationship comprises
        varying a duty cycle of the test signal by splitting the test signal sent by a transmitter into first and second branches,
        combining signals processed by the first and second branches in an AND gate to provide a reduced duty cycle,
        combining signals processed by the first and second branches in an OR gate to provide an increased duty cycle, and
        selecting, with a multiplexer, between either the increased duty cycle or the decreased duty cycle based upon a binary multiplexer control signal provided by a test register; and
    a circuit configured to analyze a received signal, which includes the transmitted signal after an effect of a duty cycle variation.

14. The apparatus as claimed in claim 13, wherein the analysis circuit comprises a bit error ratio measurement circuit.

15. The apparatus as claimed in claim 13, wherein the duty cycle varying circuit comprises:
    a splitter configured to split a transmitter output into two branches; and
    a delay element configured to delay the signal of one branch by a programmable amount of time.

16. The apparatus as claimed in claim 15, wherein the delay element comprises a variable load.

17. The apparatus as claimed in claim 13, further comprising:
    a circuit configured to determine the duty cycle variation.

18. The apparatus as claimed in claim 17, wherein the determining circuit comprises
    a low-pass filter; and
    a circuit configured to measure a dc voltage which represents the duty cycle.

19. The apparatus as claimed in claim 13, further comprising:
    a circuit configured to recover a clock signal from the received signal.

20. The apparatus as claimed in claim 19, wherein the clock recovery circuit uses the rising or falling edges of the received data, and the apparatus further comprises:

a circuit configured to select the rising or falling edges for clock recovery.

21. A data transmission and reception system, comprising:

a transmitter;

a receiver; and a testing apparatus configured for implementing a method of testing a data transmission and reception system, the method comprising:

sending a test signal from a transmitter of the system to a receiver of the system, analyzing the received test signal, varying a duty cycle relationship between the received test signal and a timing signal used by the receiver, wherein said varying the duty cycle relationship further comprises:

varying a duty cycle of the received test signal by splitting the received test signal sent by the transmitter into first and second branches, combining signals processed by the first and second branches in an AND gate to provide a reduced duty cycle;

combining signals processed by the first and second branches in an OR gate to provide an increased duty cycle;

analyzing an effect of the duty cycle variation;

performing clock recovery from received data in the receiver;

using the recovered clock to interpret the received data;

performing clock recovery from rising or falling edges of the received data;

analyzing the effect of the duty cycle variation for the recovered clock using the rising edges of the received data and the falling edges of the received data; and selecting, with a multiplexer, between either the increased duty cycle or the decreased duty cycle based upon a binary multiplexer control signal provided by a test register.

* * * * *